United States Patent [19]

Girard

[11] Patent Number: 4,736,070

[45] Date of Patent: Apr. 5, 1988

[54] MINIATURIZED LIGHTING OR OVERLOAD PROTECTIVE DEVICE AND PROTECTIVE DEVICE USED THEREIN

[76] Inventor: François Girard, 29, rue Eugène Bussière, 21000 Dijon, France

[21] Appl. No.: 892,485

[22] Filed: Aug. 1, 1986

[30] Foreign Application Priority Data

Aug. 5, 1985 [FR] France ................... 85 12069

[51] Int. Cl.$^4$ ........................................... H02G 15/08
[52] U.S. Cl. .................... 174/84 R; 174/52 PE; 174/94 R
[58] Field of Search ............. 174/84 R, 94 R, 52 PE; 361/56, 91, 111, 119

[56] References Cited

U.S. PATENT DOCUMENTS

| | | | |
|---|---|---|---|
| 3,144,507 | 8/1964 | Scadron | 174/84 R |
| 3,201,852 | 8/1965 | Yonkers | 174/84 R |
| 3,316,343 | 4/1967 | Sherlock | 174/DIG. 8 X |
| 3,525,799 | 8/1970 | Ellis | 174/94 R |
| 3,742,594 | 7/1973 | Kleinberg | 174/84 R X |
| 3,869,701 | 3/1975 | Waltz | 174/52 PE X |
| 3,889,365 | 6/1975 | Brock | 174/52 PE X |
| 4,547,827 | 10/1985 | Shedd | 361/91 X |
| 4,568,795 | 2/1986 | Wood | 174/52 PE |

Primary Examiner—Morris H. Nimmo
Attorney, Agent, or Firm—McAulay, Fields, Fisher, Goldstein & Nissen

[57] ABSTRACT

A miniaturized overload protection device for connecting electrical components and two or more electrically conductive wires and, more particularly, for connecting the adjacent end parts of the two wires together and connecting the other ends to the electrical components, comprising a protective device for connecting two electrically conductive wires together, and electrical components adapted to be connected with the electrically conductive wires. The protective device includes a binder having a low melting point, which is solid at ambient temperature to surround the adjacent end parts of the two wires when they are placed together and provides the mechanical strength therefor; and a coating made from a rigid material completely surrounding the solid binder and confining this binder in position at the time of its melting caused by a high current flowing through the conductive wires, thus maintaining the connection between the conductive wires. And, the miniaturized overload protection device includes the electrical components connected with the protective device, and the coating surrounding the binder also surrounds the electrical components.

6 Claims, 1 Drawing Sheet

4,736,070

MINIATURIZED LIGHTING OR OVERLOAD PROTECTIVE DEVICE AND PROTECTIVE DEVICE USED THEREIN

BACKGROUND OF THE INVENTION

1. Field of the Invention

The present invention relates to a miniaturized device for connecting electrically conducting elements subjected to very high currents.

Electrically conducting elements are generally connected by bringing together two conductors subjected to a pressure created by a mechanical system. These conductors are very generally made from copper more rarely from brass or silver. Since these metals are very good conductors of electricity the dimensions of the connecting wires are very small even for very high currents. For example, a hundred amps or so may be carried by a copper wire of a section of $0.1$ mm$^2$ without melting. On the other hand, the connection of such elements involves much greater dimensions of the conductors. In contact with the conductors, the resistivity is very high. That is due to oxides, to surface impurities, to the reduction of the contact area. To obtain a good connection despite this high resistivity, the connecting area is increased and of course the space required as well. These considerations lead to very large dimensions for the connection with respect to the dimensions of the conductor itself. In the case of clamping by screws and binding clips, over identical lengths, the space occupied by the connection is 30 to 100 times greater than the space occupied by the conductors.

A method of making the connection very small would be to form an autogenous weld. Now, copper does not lend itself very well to this type of welding because it is a good conductor of electricity. End welding is not 100% reliable for the production of heat is caused by the oxide on oxide connection and they remain in the weld. A laser gives no result on copper for the very pin-point heat is discharged too rapidly. Ultrasonic welding gives a satisfactory result but only for large section connections for die-stamping is required. Silver brazing is excluded because of the high temperatures required for too long a time, which is not suitable for electronic components.

2. Description of the Prior Art

A known solution for reducing the dimensions of the connection consists in forming the connection by means a of low melting point and electrically conducting binder. For easy use of this binder, fusion of the binder is used. At ambient temperature, this latter is solid and provides the mechanical connection and the electric continuity between the two conductors while holding them adjacent one another over a certain length which is embedded in an elongate welding block. This binder, generally made from a lead-tin alloy, is inevitably a less good conductor of electricity than copper, so of inferior quality and the connecting length must be very great for the very high currents so as to avoid melting of the binder; the ratio of the spaces occupied remains from 10 to 100 times greater, i.e. the volume of the final connection is from 10 to 100 times greater than the volume of the portions adjacent the two wires. The melting point of the binder is relatively low between 200° and 300° C., so as to facilitate use thereof and so as not to impair the environment (fixing elements, chips, insulators, electronic components sensitive to the heat).

A device is moreover known, as described in the patent No. GB-A-1 465 662, for providing a connection between a bar and a conducting element, usable more particularly in electrometallurgy, this device comprising, between the bar and the conducting element, a mass of an electrically conducting fluid material kept confined by a skirt made from a flexible material, so as to allow relative movement. Such a device however does not solve the problem of connecting copper or another good electrically conducting material, of small dimensions (a few millimeters) subject to very high currents (50 kA to 100 kA).

The result is that no solution known at present allows the connections to be miniaturized in a ratio of 2 to 3, instead of 10 to 100. for very high currents, while keeping very great operating or connection reliability. Such reliability of connection at very high currents is not usually necessary in electric appliances, for these very high currents are produced by fault currents. If the connection is interrupted by melting of the binder for example, that interrupts at the same time the fault current and so the reliability is increased thereby. The same cannot be said for lightning or overvoltage protectors through which very high currents flow to ground. The operating reliability requires that the connection be never interrupted even for the very high currents generated by lightning (100,000 amps). If the flow to ground were interrupted by a break in the connection, an overvoltage would appear at the terminals of the device and the overvoltage protective device would no longer serve any purpose.

The present invention aims at overcoming these drawbacks by providing a connection device of particularly simple design allowing very high miniaturization while providing 100% operating reliability in an application to a miniaturized overvoltage or lightning protector device.

SUMMARY OF THE INVENTION

For this, the miniaturized device for connecting two electrically conducting wires, usable more particularly in a lightning or overvoltage protective device, comprises, in combination, a low melting point binder, solid at ambient temperature, surrounding the adjacentand parts of the two wires and providing the mechanical strength thereof, and a covering or coating made from a rigid material surrounding the solid binder completely and confining this binder in its position when it melts under a high current, thus maintaining the connection between the conducting wires.

BRIEF DESCRIPTION OF THE DRAWINGS

Different embodiments of the present invention will be described hereafter by way of non limitative examples, with reference to the accompanying drawings in which.

DESCRIPTION OF THE PREFERRED EMBODIMENT

Figure 1:
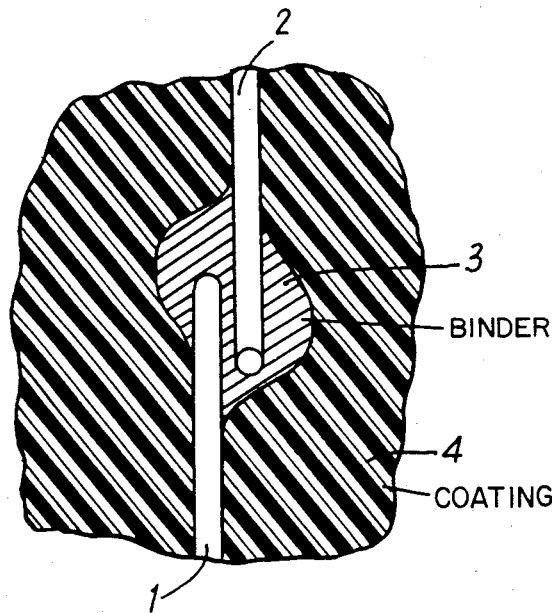
FIG. 1 is a sectional view of a miniaturized connection device between two conducting wires in accordance with the invention.

The device which is shown in FIG. 1 is intended for the electric connection of two electrically conducting wires 1 and 2, made for example from copper, whose end parts are close to one another, while being for example parallel to each other. These wires are connected electrically by a binder 3, having a low melting point (200° to 300° C.), and electrically conducting, such as a lead-tin alloy and which forms a solid mass at ambient temperature. A rigid coating 4 surrounds the whole of the connection along all the axes.

When a very high current flows through conductors 1 and 2, the resistivity of binder 3, greater than that of the conducting wires 1 and 2 and the greater resistivity at the surface of the metals means that heat is produced in the zone of binder 3, by Joule effect, in a proportion much greater than in the conductors 1 and 2. Depending on the duration of the very high current, there is partial or total melting of binder 3. This latter maintains the connection even in the liquid state, because of coating 4 which perfectly confines it about conductors 1 and 2. This coating is chosen so as to leave no air bubble between the binder 3 and the coating 4, for the probable movement of the air bubble by gravity during melting of the binder 3 could result in increasing the resistivity, this increase causing an increase in temperature by oxidization of the binder 3 because of the oxygen in the bubble and deterioration of the connection.

Coating 4 is chosen so as not to have any chemical reactivity with the binder 3. It is also chosen as a function of the foreseeable duration of melting. For example, an epoxy resin may resist for 10 ms at a temperature of 1000° C. and a ceramic for several seconds at the same temperature.

Figure 2:
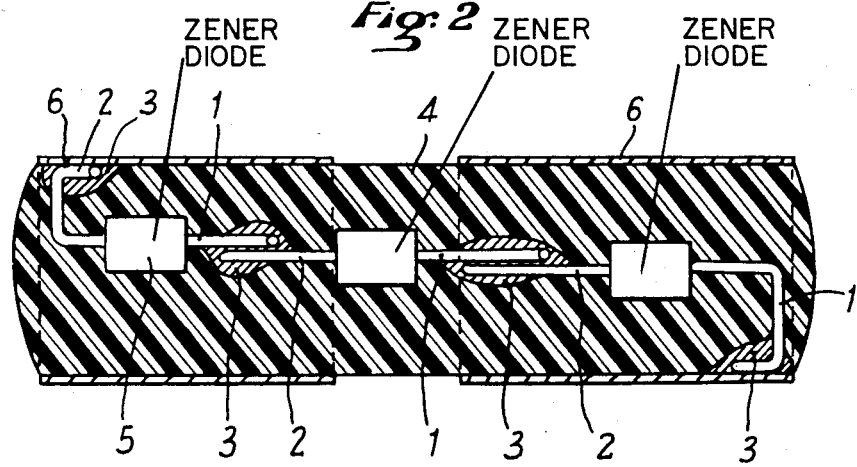
FIG. 2 is a longitudinal sectional view of an overvoltage protective device using miniaturized connection devices of the invention.

FIG. 2 shows one application of the invention to an overvoltage protective device, formed by a Zener diode assembly. This assembly may be formed, in accordance with the invention, so as to give very reduced dimensions to this assembly and to provide absolute reliability of connection. The Zener diodes 5, three in number in the example described by way of illustration, are connected together, in accordance with the invention, by a low melting point (225° C.) binder 3 in the case of semiconductors. The use of a binder with a much higher melting point would result in destruction of the semiconductor during the welding operation. Binder 3 as before provides the electric connection between the conducting wires 1 and 2 of the Zener diodes 5. The three Zener diodes are connected in series to two opposite external brass cylinders 6. A coating 4 confines all the welds formed by binder 3, four in number in the very particular embodiment described because of two welds within coating 4, between the middle Zener diode and the two end Zener diodes, and two welds at the ends between the conducting wires and the external cylinders 6. Coating 4, in this embodiment, is chosen electrically insulating. It provides both the mechanical strength, insulation of the components from each other and the confinement of the invention. Coating 4 may not necessarily be the same for each of the connections but in this embodiment coating 4 takes up no space for it fills the inevitable empty space between the different component elements. Since the coating forms no part of the bulk, the construction may be extremely miniaturized, which forms an essential advantage of the invention.

In this embodiment, another advantage of the invention resides in the operating reliability of the device for the Zener diodes are welded together as a last resort and the connections formed must be maintained despite very high currents. On the other hand, before being welded together, the Zener diodes have maintained the normal voltage of the mains and are therefore overheated. They have therefore transmitted heat through wires 1 and 2 to binder 3. In accordance with the invention, binder 3 may melt before or after melting of the Zener diodes, the connection is still maintained and the operating reliability guaranteed.

What is claimed is:

1. A miniaturized lightning or overvoltage protective device for electrically connecting the ends of two electrically conductive wires, said device including at least an end of each of two conductive wires and said ends being spaced from each other and free of direct connection with each other, each said end including an end part, comprising:

a binder having a low melting point, solid at ambient temperature, completely surrounding adjacent end parts of the two said conductive wires which are spaced from each other and are free of direct connection with each other, said binder electrically connecting said two conductive wires through their aforesaid adjacent end parts and providing the mechanical strength for the connection of said two conductive wires through their said adjacent end parts; and a coating made of a rigid material completely surrounding said solid binder and confining this binder in position should a melting of the binder occur caused by a high current, thus maintaining the connection between the conductive wires through the intermediation of said binder.

2. The device as claimed in claim 1, wherein:

said binder has a low melting point in the range of 200° to 300° C. relative to said coating, said binder having a resistivity greater than the resistivity of the conductive wires, and said coating is free of any chemical reactivity with said binder; and said coating cooperates with said binder to maintain the connection between said conductive wires even in the liquid state of said binder to prevent the existence of an air bubble between said binder and said coating.

3. The device as claimed in claim 1, wherein said binder is a lead-tin alloy and forms a solid mass at ambient temperature.

4. The device as claimed in claim 2, wherein said binder is a lead-tin alloy and forms a solid mass at ambient temperature.

5. The device as claimed in claim 1, wherein said coating is an epoxy resin.

6. The device as claimed in claim 1, wherein said coating is a ceramic.

* * * * *